(12) United States Patent
Sekiya et al.

(10) Patent No.: US 6,383,403 B1
(45) Date of Patent: May 7, 2002

(54) DRY ETCHING METHOD

(75) Inventors: Akira Sekiya, Tsukuba; Toshiro Yamada; Kuniaki Goto, both of Tokyo; Tetsuya Takagaki, Tokorozawa, all of (JP)

(73) Assignees: Japan as represented by the Director General of the Agency of Industrial Science and Technology; The Mechanical Social Systems Foundation; Electronic Industries Association of Japan; Nippon Zeon Co., Ltd., all of Tokyo (JP)

( * ) Notice: Subject to any disclaimer, the term of this patent is extended or adjusted under 35 U.S.C. 154(b) by 0 days.

(21) Appl. No.: 09/297,070

(22) PCT Filed: Oct. 30, 1997

(86) PCT No.: PCT/JP97/03968

§ 371 Date: Apr. 30, 1999

§ 102(e) Date: Apr. 30, 1999

(87) PCT Pub. No.: WO98/19332

PCT Pub. Date: May 7, 1998

(30) Foreign Application Priority Data

Oct. 30, 1996 (JP) .............................................. 8-305818
Oct. 30, 1996 (JP) .............................................. 8-305820

(51) Int. Cl.$^7$ .............................................. C03C 23/00
(52) U.S. Cl. ............................. 216/70; 216/67; 216/68; 216/69; 252/79.1; 438/710; 438/729
(58) Field of Search ............................. 216/67, 68, 69, 216/70; 252/79.1; 438/710, 729

(56) References Cited

U.S. PATENT DOCUMENTS

| | | | | |
|---|---|---|---|---|
| 4,431,477 A | * | 2/1984 | Zajac | ........................ 156/643 |
| 5,338,399 A | | 8/1994 | Yanagida | |
| 5,770,098 A | * | 6/1998 | Araki et al. | ................... 216/67 |
| 6,036,878 A | * | 3/2000 | Collins | ........................ 216/68 |

FOREIGN PATENT DOCUMENTS

| | | | | |
|---|---|---|---|---|
| EP | 0651434 | | 5/1995 | |
| JP | A 4-346427 | | 12/1992 | |
| JP | 5094974 A | * | 4/1993 | ......... H01L/21/302 |
| JP | 5283374 A | * | 10/1993 | ......... H01L/21/302 |
| JP | 6177092 A | * | 6/1994 | ......... H01L/21/302 |
| JP | A 6-275568 | | 9/1994 | |
| JP | 6318575 A | * | 11/1994 | ......... H01L/21/302 |
| JP | A 7-221068 | | 8/1995 | |
| JP | A 7-283206 | | 10/1995 | |
| JP | A 7-335611 | | 12/1995 | |
| JP | A 8-051097 | | 2/1996 | |

* cited by examiner

Primary Examiner—Randy Gulakowski
Assistant Examiner—Allan Olsen
(74) Attorney, Agent, or Firm—Armstrong, Westerman & Hattori, LLP

(57) ABSTRACT

A substrate to be etched is subjected to dry etching by using a dry etching gas containing a perfluorocycloolefin while a plasma with a high density region of at least $10^{10}/cm^3$ is generated. As the perfluorocycloolefin, those having 3 to 8 carbon atoms, especially 4 to 6 carbon atoms are preferably used.

13 Claims, No Drawings

DRY ETCHING METHOD

TECHNICAL FIELD

This invention relates to a dry etching process. More particularly, it relates to a dry etching process by which the etching can be conducted at a high rate with good selectivity to a protective thin film such as a photoresist or a polysilicon.

BACKGROUND ART

In recent years, a rapid progress has been achieved in the field of electronics. One reason therefor exists in that an extremely highly integrated semiconductor devices have been put into practice. A dry etching technique is very important for forming a fine pattern on a silicon wafer for achieving the high integration, and is constantly progressing.

In dry etching, in order to produce fluorine-containing active ingredients by plasma discharge or other means, gases of compounds containing many fluorine atoms have heretofore been used as the etching gas. As examples of the fluorine-containing etching gas, there can be mentioned highly fluorinated compounds such as carbon tetrafluoride, sulfur hexafluoride, nitrogen trifluoride, carbon trifluoromonobromide, trifluoromethane, hexafluoroethane and octafluoropropane.

International efforts for conserving the global environment are being made, and especially those for preventing or minimizing the global warming are now attracting a great interest. For example, in IPCC (Intergovernmental Panel on Climate Change), regulations on control of the total amount of carbon dioxide emission have been established in the international agreement. Under these circumstances, it is pointed that, from a viewpoint of prevention of the global warming, there is an increasing need of developing alternatives for the highly fluorinated compounds heretofore used, which have a long life in the air and cause the global warming. More specifically, it is said that carbon tetrafluoride, hexafluoroethane and sulfur hexafluoride have a life in the air of 50,000, 10,000 and 3,200 years, respectively. These fluorinated compounds exhibit a large absorbability for infrared rays and exert a considerable influence upon the global warming. Thus, it is eagerly desired to develop an etching method utilizing a novel etching gas which does not cause the temperature rise of the globe and has etching performances comparable to those of the heretofore used etching gases.

Various proposals have been made for enhancing the selectivity to a protective thin film such as photoresist or polysilicon in a dry etching method. For example, a proposal has been made in Japanese Unexamined Patent Publication No. H4-170026 wherein a silicon compound is etched by using a gas containing an unsaturated fluorocarbon such as perfluoropropene or perfluorobutene while the temperature of the substrate to be etched is controlled to a temperature not higher than 50° C. Another proposal has been made in Japanese Unexamined Patent Publication No. H4-258117 wherein etching is effected in a manner similar to the above proposal by using a gas containing a cyclic saturated or cyclic unsaturated fluorocarbon such as perfluorocyclopropane, perfluorocyclobutane, perfluorocyclobutene or perfluorocyclopentene, while the temperature of the substrate to be etched is controlled to a temperature not higher than 50° C.

However, in the dry etching methods heretofore proposed in the above patent publications, the rate of etching and the selectivity to a protective thin film such as photoresist or polysilicon is not high to a satisfying extent, and a problem arises in that a polymer film is undesirably produced by deposition on the surface of wafer.

DISCLOSURE OF THE INVENTION

In view of the foregoing conventional techniques, the object of the present invention is to provide a dry etching process by which etching is conducted with a high selectivity to a protective thin film such as photoresist or polysilicon and at a high etching rate without formation of a polymer film by deposition, and thus, good etching results are obtained.

The inventors have continued researches into dry etching of a silicon compound by using dry etching gases containing perfluorocycloolefins, and found that, when the dry etching is conducted by using a dry etching gas containing octafluorocyclopentene while a plasma with a high density region of at least $10^{10}/cm^3$ is generated, satisfactory etching can be achieved at a high etching rate with a high selectivity to photoresist and a high selectivity to polysilicon and without deposition of a polymer film.

In accordance with the present invention, there is provided a dry etching process characterized in that a substrate to be etched is subjected to dry etching by using a dry etching gas containing octafluorocyclopentene while a plasma with a high density region of at least $10^{10}/cm^3$ is generated.

BEST MODE FOR CARRYING OUT THE INVENTION

The dry etching gas used in the present invention is characterized by comprising octafluorocyclopentene.

If desired, a fluorocarbon selected from perfluorocycloolefins other than octafluorocyclopentene, and straight chain unsaturated perfluorocarbons, and, perfluoroalkanes and perfluorocycloalkanes may be used, in combination with octafluorocyclopentene. However, if these optional perfluorocarbons are used in a salient amount, the object of the present invention cannot be achieved. Therefore, the amount of these perfluorocarbons is usually not larger than 30% by weight, preferably not larger than 20% by weight and more preferably not larger than 10% by weight, based on the total amount of the fluorocarbons.

Hydrofluorcarbons may also be used in combination with the above-mentioned octafluorocyclopentene as an etching gas.

The hydrofluorocarbon gases used are not particularly limited provided that they are volatile. Usually, the hydrofluorocarbons used are selected from straight chain or branched chain or cyclic saturated hydrocarbons, of which at least half of the hydrogen atoms have been substituted by fluorine atoms. As specific examples of the saturated hydrofluorocarbon gases, there can be mentioned trifluoromethane, pentafluoroethane, tetrafluoroethane, heptafluoropropane, hexafluoropropane, pentafluoropropane, nonafluorobutane, octafluorobutane, heptafluorobutane, hexafluorobutane, undecafluoropentane, decafluoropentane, nonafluoropentane, octafluoropentane, tridecafluorohexane, dodecafluorohexane, undecafluorohexane, heptafluorocyclobutane, hexafluorocyclobutane, nonafluorocyclopentane, octafluorocyclopentane and heptafluorocyclopentane. Of these, trifluoromethane, pentafluoroethane and tetrafluoroethane are preferable. The hydrofluorocarbon gases may be used either alone or as a combination of at least two thereof.

The amount of the hydrofluorocarbon gas used in combination with octafluorocyclopentene varies depending upon the material of substrate to be etched, but is usually not larger than 50% by mole and preferably not larger than 30% by mole, based on the octafluorocyclopentene.

According to the need, various gases generally used for dry etching can be added in the dry etching gas used in the present invention. Such added gases include, for example, oxygen gas, nitrogen gas, argon gas, hydrogen gas, chlorine gas, carbon monoxide gas, carbon dioxide gas, nitrogen oxide gas and sulfur oxide gas. Of these, oxygen gas and carbon dioxide gas are preferable. Oxygen gas is most preferable. These gases may be used either alone or as a combination of at least two thereof.

The amount of the gas optionally incorporated varies depending upon the particular degree of influence of the gas perfluoro-3-methylcyclobutene, perfluoro-1-methylcyclopentene and perfluoro-3-methylcyclopentene are preferable. Perfluorocyclopentene is most preferable. These perfluorocycloolefins are used either alone or as a combination of at least two thereof.

In the present invention, perfluoroolefins other than the perfluorocycloolefins, namely, straight chain unsaturated perfluorocarbons, and/or straight chain perfluoroalkanes and/or perfluorocycloalkanes may be used, in combination with the perfluorocycloolefins. However, if these optional perfluorocarbons are used in a salient amount, the object of the present invention cannot be achieved. Therefore, the amount of these perfluorocarbons is usually not larger than 30% by weight, preferably not larger than 20% by weight and more preferably not larger than 10% by weight, based on the total amount of the fluorocarbons.

Hydrofluorcarbons may also be used in combination with the above-mentioned perfluorocycloolefins as an etching gas.

The hydrofluorocarbon gases used are not particularly limited provided that they are volatile. Usually, the hydrofluorocarbons used are selected from straight chain or branched chain or cyclic saturated hydrocarbons, of which at least half of the hydrogen atoms have been substituted by fluorine atoms. As specific examples of the saturated hydrofluorocarbon gases, there can be mentioned trifluoromethane, pentafluoroethane, tetrafluoroethane, heptafluoropropane, hexafluoropropane, pentafluoropropane, nonafluorobutane, octafluorobutane, heptafluorobutane, hexafluorobutane, undecafluoropentane, decafloropentane, nonafluoropentane, octafluorpentane, tridecafluorohexane, dodecafluorohexane, undecafluorohexane, heptafluorocyclobutane, hexaflurocyclobutane, nonafluorocyclopentane, octafluorocyclopentane and heptafluorocyclopentane. Of these, trifluoromethane, pentafluoroethane and tetrafluoroethane are preferable. The hydrofluorocarbon gases may be used either upon the material of substrate to be etched, but, is usually not larger than 40 parts by weight and preferably in the range of 3 to 25 parts by weight, based on 100 parts by weight of the dry etching gas containing octafluorocyclopentene.

The substrate to be etched has a structure such that a thin film layer of a material to be etched is formed on a sheet-form substrate such as a glass sheet, a silicon monocrystal wafer or a gallium-arsenic substrate. As specific examples of the material to be etched, there can be mentioned silicon oxide, silicon nitride, aluminum, tungsten, molybdenum, tantalum, titanium, chromium, chromium oxide and gold. As preferable example of the substrate to be etched, there can be mentioned a silicon wafer having a silicon oxide thin film or an aluminum thin film, formed thereon. In the case where a silicon oxide thin film is etched, the silicon oxide thin film preferably has a protective thin film composed of photoresist or polysilicon.

In the dry etching process of the present invention, a plasma with a high density region of at least $10^{10}$ ions/cm$^3$ is generated for etching. Preferably a plasma with a high density in the range of about $10^{10}$ ions/cm$^3$ to $10^{12}$ ions/cm$^3$ is generated for achieving a high etching performance and forming a fine pattern. If the plasma density is too low, the high rate of etching, and the high selectivity to photoresist and polysilicon, intended by the present invention, cannot be attained. Further, an undesirable formation of polymer film by deposition is apt to occur.

In conventional dry etching processes utilizing a reactive ion etching system such as a parallel flat plate type or a magnetron type, it is difficult or impossible to generate a plasma with the above-mentioned high density region. Preferably a helicon wave type and a high-frequency induction type are employed for generating a plasma with the high density region.

In the dry etching process of the present invention, the pressure of the above-mentioned dry etching gas composition comprising a perfluorocycloolefin and optional other gases is not particularly limited, and generally, the etching gas composition is introduced within an etching apparatus to an extent such that the inner pressure of the vacuumed etching apparatus reaches a pressure in the range of about 10 Torr to $10^{-5}$ Torr, and preferably $10^{-2}$ Torr to $10^{-3}$ Torr.

The temperature to which the substrate to be etched reaches is usually in the range of 0° C. to about 300° C., preferably 60° C. to 250° C. and more preferably 80° C. to 200° C.

It is preferable that the etching is conducted without substantial control of the reached temperature of the substrate to be etched. By the term "without substantial control of the reached temperature" used herein, we mean that the etching is conducted under conditions such that the substrate is maintained at a temperature falling within the range of ±30% of the temperature which the substrate reaches when the temperature is not controlled at all, preferably within ±20% of said temperature and more preferably within ±10% of said temperature. Therefore, a procedure for purposely and rapidly cooling the substrate heated up due to the exothermic heat upon etching is not adopted, but a procedure of controlling the cooling rate so that the substrate is slowly cooled may be adopted in the process of the present invention. The temperature of the substrate is maintained usually in the range of 60 to about 250° C. and preferably 80 to 200° C. when the etching is conducted without substantial control of the reached temperature, and, under such temperature conditions, a high rate of etching can be achieved while a high selectivity to polysilicon and to photoresist can be kept. Further, under these moderate temperature conditions, an undesirable deposition of polymer occurring due to polymerization of a perfluorocycloolefin can be avoided.

The time for the etching treatment is in the range of about 10 seconds to about 10 minutes. But, according to the process of the present invention, a high rate of etching can be effected, and thus, preferably the etching time is in the range of 10 seconds to 3 minutes in view of the productivity.

The invention will now be described more specifically by the following examples, but, these examples by no means limit the scope of the invention.

EXAMPLES 1 TO 9

Three kinds of silicon wafers each having a diameter of 150 mm, on a surface of which a silicon oxide ($SiO_2$) thin film, a photoresist (PR) thin film or a polysilicon (Poly-Si) thin film was formed, were set within a helicon wave-type plasma etching apparatus ("I-4100SH type" made by Anelva Corp.). The inside of the etching apparatus was vacuumed and then an etching gas containing octafluorocyclopentene was introduced into the etching apparatus at a flow rate of 50 sccm. Etching was conducted under plasma-irradiation conditions with density regions varied by changing the electrical energy for generation of plasma as shown in Table 1, while the pressure inside the etching apparatus was maintained at 5 mTorr. The temperature of the wafers was not controlled, and, all of the three wafers reached about 130° C. The etching times were in the range of 15 to 60 seconds. The etching rate was measured at five points on each wafer, namely, (i) the center, (ii) two points 35 mm apart from the center in opposite directions on a diameter, and (iii) two points 65 mm apart from the center in opposite directions on the diameter.

The etching rates measured at the above recited five points on a diameter of the wafer are referred to as etching rate-1, -2, -3, -4 and -5, respectively, in the above-recited order.

The selectivity for etching to photoresist and that to polysilicon were evaluated by comparing the etching rates as measured on silicon oxide ($SiO_2$), photoresist (PR) and polysilicon (Poly-Si) under the same etching conditions, and calculating the selectivity to PR and that to poly-Si according to the following equation.

Selectivity=(Average etching rate on $SiO_2$)/(average etching rate on PR or poly-Si)

The etching conditions and the results are shown in Table 1.

The three kinds of wafers used were prepared as follows.

$SiO_2$: a silicon oxide thin film was formed on a surface of wafer.

PR: a surface of wafer was coated with photoresist.

Poly-Si: a polysilicon thin film was formed on a surface of wafer.

The life in the air of the octafluorocyclopentene used as the etching gas was proved to be 1.0 year as measured on the rate of reaction with a hydroxyl radical. Thus, it was confirmed that the influence upon the global warming is extremely low. Further, the life in the air of octafluorocyclopentene was also presumed to be 0.3 year as calculated from the HOMO energy of molecule according to Atmospheric Environment, vol. 26A, No.7, p1331 (1992).

TABLE 1

Octafluorocyclopentene-containing Gas Used Etching

| | Example No. | | | | | | | | |
|---|---|---|---|---|---|---|---|---|---|
| | 1 | 2 | 3 | 4 | 5 | 6 | 7 | 8 | 9 |
| Wafer | $SiO_2$ | PR | Poly-Si | $SiO_2$ | PR | Poly-Si | $SiO_2$ | PR | Poly-Si |
| Power load (W) | 500 | 500 | 500 | 800 | 800 | 800 | 1100 | 1100 | 1100 |
| Plasma density (ions/cm³) | $10^{10-11}$ | $10^{10-11}$ | $10^{10-11}$ | $10^{11}$ | $10^{11}$ | $10^{11}$ | $10^{11-12}$ | $10^{11-12}$ | $10^{11-12}$ |
| Etching time (sec) | 60 | 60 | 15 | 60 | 60 | 15 | 60 | 60 | 15 |
| Etching rate (A/min) | | | | | | | | | |
| Rate-1 | 4116 | 657 | 304 | 6187 | 2517 | 976 | 7022 | 3503 | 1400 |
| Rate-2 | 4697 | 838 | 364 | 6480 | 2503 | 972 | 7034 | 3297 | 1336 |
| Rate-3 | 4811 | 907 | 372 | 6632 | 2558 | 988 | 7114 | 3297 | 1308 |
| Rate-4 | 4307 | 715 | 308 | 6402 | 2468 | 960 | 7048 | 3286 | 1332 |
| Rate-5 | 3511 | 498 | 236 | 5828 | 2468 | 920 | 7022 | 3564 | 1408 |
| Average rate | 4288 | 723 | 317 | 6306 | 2503 | 963 | 7048 | 3389 | 1357 |
| Selectivity to | | 5.9 | | | 2.5 | | | 2.1 | |
| Photoresist | | | | | | | | | |
| Polysilicon | | 13.5 | | | 6.6 | | | 5.2 | |

Comparative Examples 1 to 3

Silicon wafers each having a diameter of 150 mm, on a surface of which a silicon oxide ($SiO_2$) thin film was formed, were set within a parallel plate-type reactive ion plasma etching apparatus ("TE5000S" made by Tokyo Electron Co.). Etching was conducted by the same procedures as employed in Example 4 wherein a part of the etching conditions was varied as follows.

Flow rate of octafluorocyclopentene: 40 sccm

Inner pressure:

150 mTorr (Comparative Example 1)

250 mTorr (Comparative Example 2)

350 mTorr (Comparative Example 3)

Plasma density: $5 \times 10^9/cm^3$

As the results of etching, in all of the inner pressures employed, octafluorocyclopentene was polymerized to be deposited as a polymer film on the surface of wafer, and etching was not effected.

Comparative Examples 4 to 12

The dry etching procedures as employed in Examples 1 to 9 were repeated wherein carbon tetrafluoride was employed instead of octafluorocyclopentene with all other conditions remaining the same. The results are shown in Table 2.

Comparative Example 13 to 21

The dry etching procedures as employed in Examples 1 to 9 were repeated wherein octafluorocyclobutane was employed instead of octafluorocyclopentene with all other conditions remaining the same. The results are shown in Table 3.

TABLE 2

Carbon tetrafluoride-containing Gas Used Etching

| | Comparative Example | | | | | | Example No. | | |
|---|---|---|---|---|---|---|---|---|---|
| | 4 | 5 | 6 | 7 | 8 | 9 | 10 | 11 | 12 |
| Wafer | $SiO_2$ | PR | Poly-Si | $SiO_2$ | PR | Poly-Si | $SiO_2$ | PR | Poly-Si |
| Power load (W) | 500 | 500 | 500 | 800 | 800 | 800 | 1100 | 1100 | 1100 |
| Plasma density (/cm³) | $10^{10-11}$ | $10^{10-11}$ | $10^{10-11}$ | $10^{11}$ | $10^{11}$ | $10^{11}$ | $10^{11-12}$ | $10^{11-12}$ | $10^{11-12}$ |
| Etching time (sec) | 60 | 60 | 15 | 60 | 60 | 15 | 60 | 60 | 15 |
| Etching rate (A/min) | | | | | | | | | |
| Rate-1 | 3517 | 4956 | 3644 | 4849 | 7007 | 5088 | 5953 | 8862 | 6260 |
| Rate-2 | 3464 | 4854 | 3488 | 4765 | 6695 | 4832 | 5622 | 8162 | 5892 |
| Rate-3 | 3518 | 4772 | 3436 | 4712 | 6494 | 4700 | 5381 | 7913 | 5544 |
| Rate-4 | 3425 | 4761 | 3436 | 4738 | 6637 | 4928 | 5655 | 8182 | 5992 |
| Rate-5 | 3443 | 4767 | 3540 | 4723 | 6770 | 5168 | 5846 | 8605 | 6384 |
| Average rate | 3473 | 4822 | 3509 | 4757 | 6721 | 4943 | 5691 | 8345 | 6014 |
| Selectivity to Photoresist | | 0.72 | | | 0.71 | | | 0.68 | |
| Polysilicon | | 0.99 | | | 0.96 | | | 0.95 | |

TABLE 3

Octafluorocyclobutane-containing Gas Used Etching

| | Comparative Example | | | | | | Example No. | | |
|---|---|---|---|---|---|---|---|---|---|
| | 13 | 14 | 15 | 16 | 17 | 18 | 19 | 20 | 21 |
| Wafer | $SiO_2$ | PR | Poly-Si | $SiO_2$ | PR | Poly-Si | $SiO_2$ | PR | Poly-Si |
| Power load (W) | 500 | 500 | 500 | 800 | 800 | 800 | 1100 | 1100 | 1100 |
| Plasma density (ions/cm³) | $10^{11-12}$ | $10^{11-11}$ | $10^{11-11}$ | $10^{11}$ | $10^{11}$ | $10^{11}$ | $10^{11-12}$ | $10^{11-12}$ | $10^{11-12}$ |
| Etching time (sec) | 60 | 60 | 15 | 60 | 60 | 15 | 60 | 60 | 15 |
| Etching rate (A/min) | | | | | | | | | |
| Rate-1 | 4753 | 3256 | 1476 | 6422 | 5077 | 2364 | 7494 | 6227 | 2956 |
| Rate-2 | 4983 | 3348 | 1492 | 6390 | 4915 | 2328 | 7189 | 5764 | 2776 |
| Rate-3 | 4953 | 3334 | 1484 | 6449 | 4917 | 2324 | 6955 | 5588 | 2712 |
| Rate-4 | 4693 | 3121 | 1416 | 6306 | 4794 | 2328 | 7315 | 5799 | 2824 |
| Rate-5 | 4380 | 2963 | 1360 | 6308 | 4973 | 2400 | 7483 | 6211 | 2988 |
| Average rate | 4752 | 3204 | 1445 | 6375 | 4935 | 2349 | 7287 | 5918 | 2851 |
| Selectivity to Photoresist | | 1.5 | | | 1.3 | | | 1.2 | |
| Polysilicon | | 3.3 | | | 2.7 | | | 2.6 | |

INDUSTRIAL APPLICABILITY

By conducting dry etching of a substrate to be etched by using a dry etching gas containing octafluorocyclopentene while a plasma with a high density region is generated according to the present invention, the dry etching can be conducted with a high selectivity to photoresist or polysilicon and at a high etching rate without formation of a polymer film by deposition.

What is claimed is:

1. A dry etching process characterized in that a substrate to be etched in subjected to dry etching by using a dry etching gas containing octafluorocyclopentene while a plasma with a high density region of at least $10^{10}$ ions/cm³ is generated at a reached temperature of the substrate in the range of 60° C. to 250° C. without substantial control of the reached temperature of the substrate, and at a pressure of the gas in the range of 10 Torr to $10^{-5}$ Torr.

2. The dry etching process according to claim 1, wherein said dry etching gas containing octafluorocyclopentene is comprised of octafluorocyclopentene and a hydrofluorocarbon.

3. The dry etching process according to claim 2, wherein said hydrofluorocarbon is a straight chain or branched chain or cyclic saturated hydrocarbon, of which at least half of the hydrogen atoms have been substituted by fluorine atoms.

4. The dry etching process according to claim 2, wherein the amount of the hydrofluorocarbon is not larger than 50% by mole based on the octafluorocyclopentene.

5. The dry etching process according to claim 2, wherein the amount of the hydrofluorocarbon is not larger than 30% by mole based on the octafluorocyclopentene.

6. The dry etching process according to claim 1, wherein said dry etching gas containing octafluorocyclopentene further comprises an added gas.

7. The dry etching process according to claim 6, wherein said added gas is selected from oxygen gas, nitrogen gas, argon gas, hydrogen gas, chlorine gas, carbon monoxide gas, carbon dioxide gas, nitrogen oxide gas and sulfur oxide gas.

8. The dry etching process according to claim 6, wherein the amount of the added gas is not larger than 40% by weight based on 100 parts by weight of the dry etching gas containing octafluorocyclopentene.

9. The dry etching process according to claim 1, wherein the substrate to be etched has a structure such that a thin film layer of a material to be etched is formed on a substrate selected from a glass sheet, a silicon monocrystal wafer and a gallium-arsenic substrate plate.

10. The dry etching process according to claim 1, wherein the plasma density is in the range of $10^{10}$ ions/cm$^3$ to $10^{12}$ ions/cm$^3$.

11. The dry etching process according to claim 1, wherein the plasma with a high density region is generated by using a helicon wave system.

12. The dry etching process according to claim 1, wherein the plasma with a high density region is generated by using a high-frequency induction type system.

13. The dry etching process according to claim 1, wherein the plasma is generated at a reached temperature of the substrate in the range of 80 to 200° C.

* * * * *